United States Patent
Fischer et al.

(10) Patent No.: US 10,461,031 B2
(45) Date of Patent: Oct. 29, 2019

(54) METHOD FOR PATTERNING A POWER METALLIZATION LAYER, ELECTRONIC DEVICE AND METHOD FOR PROCESSING AN ELECTRONIC DEVICE

(71) Applicant: Infineon Technologies AG, Neubiberg (DE)

(72) Inventors: Petra Fischer, Wernberg (AT); Johanna Schlaminger, Klagenfurt (AT); Monika Cornelia Voerckel, Finkenstein (AT); Peter Zorn, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/003,687

(22) Filed: Jun. 8, 2018

(65) Prior Publication Data
US 2018/0358299 A1    Dec. 13, 2018

(30) Foreign Application Priority Data

Jun. 9, 2017 (DE) .................. 10 2017 112 780

(51) Int. Cl.
| | |
|---|---|
| H01L 21/283 | (2006.01) |
| H01L 23/532 | (2006.01) |
| H01L 21/3213 | (2006.01) |
| H01L 21/768 | (2006.01) |
| H01L 23/528 | (2006.01) |

(52) U.S. Cl.
CPC .. *H01L 23/53238* (2013.01); *H01L 21/32134* (2013.01); *H01L 21/32139* (2013.01); *H01L 21/76852* (2013.01); *H01L 23/5286* (2013.01)

(58) Field of Classification Search
CPC .......... H01L 23/53238; H01L 23/5286; H01L 21/32134; H01L 21/32139; H01L 21/76852
See application file for complete search history.

(56) References Cited

U.S. PATENT DOCUMENTS

| | | |
|---|---|---|
| 2011/0076567 A1 | 3/2011 | Bouillon |
| 2014/0127906 A1* | 5/2014 | Cabral, Jr. ........ H01L 21/32131 438/694 |
| 2016/0218033 A1* | 7/2016 | Joshi ................. H01L 21/32134 |
| 2016/0343662 A1 | 11/2016 | Fischer et al. |

FOREIGN PATENT DOCUMENTS

| | | |
|---|---|---|
| DE | 102011053259 A1 | 3/2012 |
| DE | 102016100258 A1 | 7/2016 |

* cited by examiner

*Primary Examiner* — Ali Naraghi
(74) *Attorney, Agent, or Firm* — Slater Matsil, LLP (57) ABSTRACT

According to various embodiments, a method for processing an electronic device may include: forming a patterned hard mask layer over a power metallization layer, the patterned hard mask layer exposing at least one surface region of the power metallization layer; and patterning the power metallization layer by wet etching of the exposed at least one surface region of the power metallization layer.

20 Claims, 5 Drawing Sheets

FIG. 1

110 — Forming a patterned hard mask layer over a copper power metallization layer, the patterned hard mask layer exposing at least one surface region of the copper power metallization layer 120 — Patterning the copper power metallization layer by wet etching of the exposed at least one surface region of the copper power metallization layer

METHOD FOR PATTERNING A POWER METALLIZATION LAYER, ELECTRONIC DEVICE AND METHOD FOR PROCESSING AN ELECTRONIC DEVICE

This application claims the benefit of German Application No. 102017112780.1, filed on Jun. 9, 2017, which application is hereby incorporated herein by reference.

TECHNICAL FIELD

Various embodiments relate generally to a method for patterning a power metallization layer, an electronic device and a method for processing an electronic device.

BACKGROUND

In general, a semiconductor substrate, a semiconductor wafer, or any other suitable type of carrier may be processed in semiconductor technology to form an integrated circuit or a semiconductor device based on at least one integrated circuit structure. A semiconductor wafer may be used for processing a plurality of integrated circuits at a surface of the wafer and, after processing, the wafer may be diced to provide a plurality of dies or chips from the wafer. Finally, the dies or chips being singulated from the wafer (so called bare dies or bare chips) may be packaged in a packaging process, wherein the dies or chips may be encased in a supporting material or in a housing to prevent, for example, physical damage and/or corrosion. The housing (also called package or case) may also support the electrical connections used to connect the device, for example, to a circuit board. Typically, a die or a chip includes a metallization for controlling or operating the integrated circuit. Terminals of an integrated circuit structure (e.g. a source terminal, a drain terminal, and/or a gate terminal of a field effect transistor or an emitter terminal, a collector terminal, and/or a base terminal of a bipolar transistor, or two terminals of a diode) may be contacted by the metallization to control or operate the integrated circuit structure. A metallization may include a front side metallization and/or a backside metallization. Further, a metallization may include a patterned metal or a patterned metallic material (e.g. provided in copper technology or in aluminum technology) that may provide one or more electrical contacts (contact pads) and a wiring. Further, the metallization may electrically contact a single integrated circuit structure (e.g. a thyristor, transistor, or a diode). Alternatively, the metallization may electrically contact a plurality of integrated circuit structures of a chip (e.g. a plurality of thyristors, a plurality of transistors, or a plurality of diodes), wherein the metallization may support or may provide the functionality of the chip due to the specific wiring structure.

SUMMARY

According to various embodiments, a method for processing an electronic device may include: forming a patterned hard mask layer over a power metallization layer, the patterned hard mask layer exposing at least one surface region of the power metallization layer; and patterning the power metallization layer by wet etching of the exposed at least one surface region of the power metallization layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on"

the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" extension of a structure (or of a structure element) provided on or in a carrier (e.g. a layer, a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

The term "electrically conductively connected" that is used herein to describe an electrical connection between two terminals, two contacts, etc. may be understood as an electrically conductive connection with ohmic behavior, e.g. provided by a metal or degenerate semiconductor in absence of p-n junctions in the current path. The term "contacted" that is used herein to describe an electrical contact between a terminal and a semiconductor region, or the like, may be understood as direct physical and/or direct electrical contact.

Various embodiments are related to the patterning of a metal layer in semiconductor technology, wherein the metal layer has a relatively large thickness. Wet etching may be used for patterning a thick metal layer, e.g. a metal layer having a thickness greater than about 1 μm. It was found that wet etching might lead to a formation of solid notches at the edge of the etched metal layer, particularly in the presence of an underlying barrier layer, e.g. a Titanium/Tungsten (TiW) barrier layer, or another suitable barrier layer.

The wet etching may be carried out, for example, based on diluted etchants (e.g., using a diluted etching solution, e.g. a so-called Cu-Seed etching solution). According to various embodiments, it was found that using a diluted etchant for patterning a thick metal layer might result in the formation of distorted (e.g. rounded, beveled, tapered or blunted) metal edges. Furthermore, a strong attack of the resist mask may occur due to prolonged etching times (especially in the case of a thick metal layer) with diluted etch mixtures. As a result, the resist mask may break and/or an undefined under-etching may occur.

Further, it was found that etching a copper layer with a diluted etchant (e.g., using diluted mixtures of phosphoric acid or sulfuric acid with peroxide, so-called Cu-Seed mixtures) may lead to severe under-etching due to a weak resist adhesion on the copper layer and consequently to distorted (e.g. rounded, beveled, tapered or blunted) metal edges after the wet etching. Furthermore, the highly under-etched resist may break during etching and may lead to an undesirable etching of the copper layer.

However, it may be desired to generate metal structures (e.g. metal lines and/or metal pads, etc.) having a substantially rectangular cross-section (i.e. a sidewall of the metal structures having an angle close to 90° with respect to the underlying surface of the carrier) to provide a high current carrying capability and, at the same time, a small features size. In other words, it may be desired to generate metal structures having a sidewall with a steep rise.

According to various embodiments, a hard mask may be used for patterning a thick metal layer, e.g. for patterning a copper layer having a thickness of several micrometers or more. Therefore, the formation of distorted edges can be avoided during patterning the metal layer by wet etching. According to various embodiments, it was found, that a thin oxide layer, e.g. a thin $Al_2O_3$-layer deposited for example by atomic layer deposition, may be sufficient as a hard mask for patterning a thick metal layer (for example a thick copper layer) by wet etching, independently from the used etch solutions, to form thick metal structures with a well-defined sharp metal edge, i.e. in contrast to a distorted metal edge.

Figure 1:
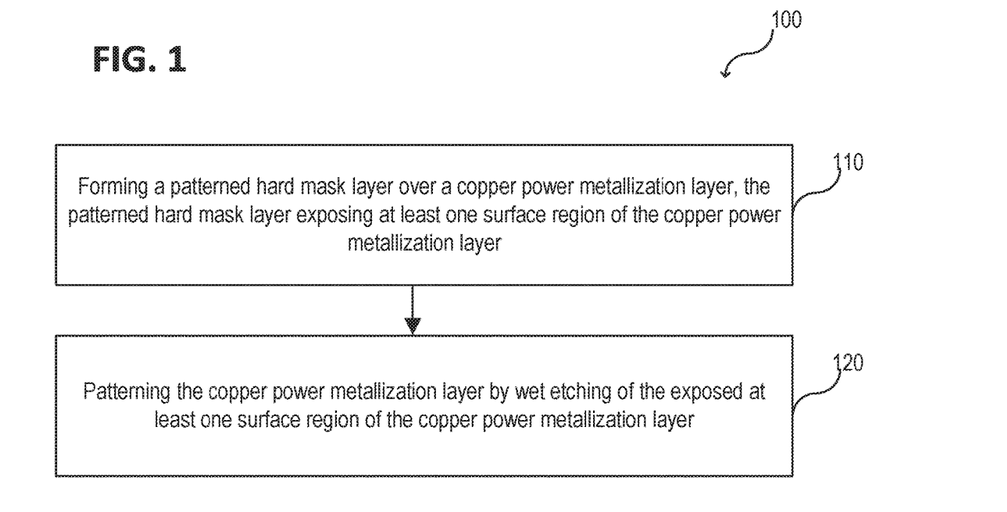
FIG. 1 shows a schematic flow diagram of a method for processing an electronic device, according to various embodiments.

FIG. 1 illustrates a schematic flow diagram of a method 100 for processing an electronic device, according to various embodiments. The method 100 may include: in no, forming a patterned hard mask layer over a copper power metallization layer, the patterned hard mask layer exposing at least one surface region of the copper power metallization layer; and, in 120, patterning the copper power metallization layer by wet etching of the exposed at least one surface region of the copper power metallization layer. According to various embodiments, a patterned power metallization layer may be also referred to as power metallization structure.

According to various embodiments, one or more patterning processes (also referred to as patterning) may be included in the method 100 for processing an electronic device. A patterning process may include removing selected portions of a surface layer or, in other words, removing selected portions of a material. According to various embodiments, a plurality of trenches, recesses and/or holes may be formed in a carrier or in a surface layer using a patterning process. Patterning a layer may be used to form a patterned layer, e.g. to form a patterned hard mask layer or a patterned power metallization layer, and/or the like. Since a plurality of processes may be involved, there are various possibilities to perform a patterning process (e.g. using a resist mask), wherein aspects may be: selecting at least one portion of a surface layer (or a material or of a carrier) which shall be removed, e.g. using at least one lithographic process; and removing the selected portions of the surface layer, e.g. using at least one etch process. According to various embodiments, a hard mask may be formed by patterning a hard mask layer via a resist mask.

Figure 2A:
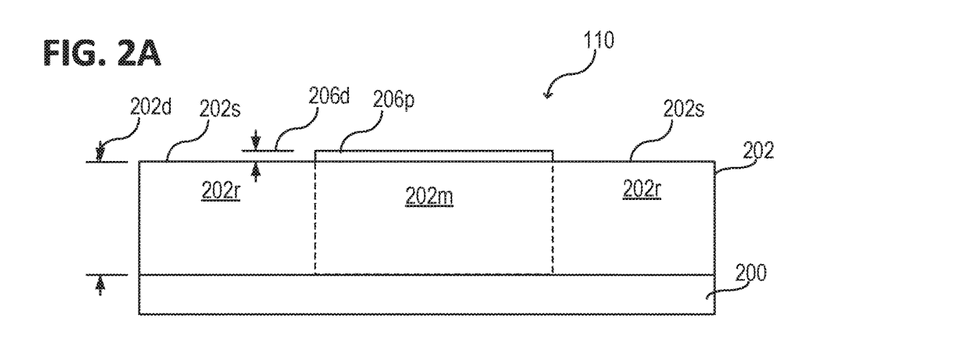
FIGS. 2A and 2B show an electronic device during processing in various schematic views, according to various embodiments.
Figure 2B:
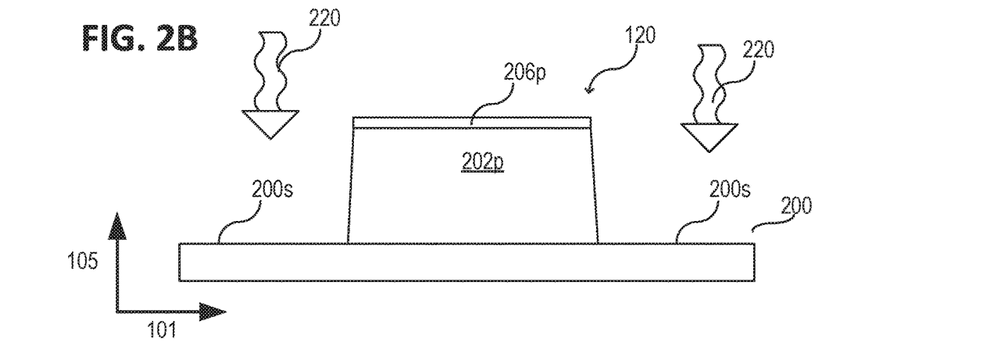

FIG. 2A and FIG. 2B illustrate an electronic device in a schematic cross-sectional view during processing, e.g. during method 100 is carried out, according to various embodiments. As illustrated in FIG. 2A, a power metallization layer 202 (e.g. including or consisting of copper) may be disposed over a carrier 200 and a patterned hard mask layer 206p may be disposed over the power metallization layer 202, e.g. after process no of method 100 is carried out. As illustrated in FIG. 2B, a power metallization structure 202p may be disposed over the carrier 200, wherein the power metallization structure 202p is formed by patterning the power metallization layer 202, e.g. in process 120 of method 100.

According to various embodiments, the carrier 200 may be or may include any suitable type of carrier (e.g. a semiconductor workpiece, etc.) including any desired electronic structure to be contacted by the power metallization structure 202p. To provide a power metallization with sufficient high current load capacity, the power metallization layer 202 is formed with a thickness 202d greater than about 5 µm, e.g. with a thickness greater than about 8 µm, e.g. with a thickness in the range from about 5 µm to about 20 µm. Therefore, the power metallization structure 202p may have a thickness 202d greater than about 5 µm as well.

As illustrated in FIG. 2A, the patterned hard mask layer 206p exposes at least one surface region 202S of the power metallization layer 202. Illustratively, the patterned hard mask layer 206p defines at least one first region 202r and at least one second region 202m, wherein the at least one first region 202r is (e.g. completely) removed by wet etching 220 and wherein the at least one second region 202M remains after wet etching 220. As described above, the wet etching 220 is carried out to provide the desired power metallization structure 202p over the carrier 200. The at least one first region 202r of the power metallization layer 202 that shall be removed by wet etching 220 is exposed in the at least one surface region 202S. The patterned hard mask layer 206p covers (e.g. in direct physical contact) the at least one second region 202M of the power metallization layer 202 that shall remain over the carrier 200 to provide the power metallization structure 202p.

According to various embodiments, the patterned hard mask layer 206p may include at least one hard mask material of the following group of materials: a metal or a metalloid, a nitride (e.g. a metal nitride or a metalloid nitride), an oxide (e.g. a metal oxide or a metalloid oxide), or an oxynitride (e.g. a metal oxynitride or a metalloid oxynitride). According to various embodiments, the hard mask materials may include or may consist of titanium nitride, tantalum nitride, hafnium nitride, boron nitride, silicon nitride, silicon oxide, or any other suitable hard mask material, e.g. carbon (for example diamond-like-carbon (DLC)).

According to various embodiments, the patterned hard mask layer 206p may be thinned (i.e. partially removed) or completely removed after the wet etching 220 is carried out, e.g. after process 120 of method 100 is carried out. Alternatively, the patterned hard mask layer 206p may remain over the power metallization structure 202p as a protection layer.

According to various embodiments, the patterned hard mask layer 206p may be a patterned aluminum oxide ($Al_2O_3$, also referred to as alumina) layer. It was found that a thin patterned alumina layer 206p sufficiently masks the power metallization layer 202 during the wet etching 220 and, at the same time, may also remain on the patterned power metallization layer 202p after the wet etching 220, since a bonding or soldering process may not be affected by the thin patterned alumina layer 206p. The thin patterned alumina layer is formed for example with a thickness 206d less than about 15 nm, e.g. with a thickness in the range from about 3 nm to about 15 nm. However, a thicker patterned alumina layer 206p may be used for the wet etching 220 as well, wherein, in this case, the patterned alumina layer 206p may be thinned to a thickness 206d less than about 15 nm or the patterned alumina layer 206p may be completely removed after the wet etching 220 is carried out.

As illustrated in FIG. 2B, the at least one surface region 202S of the power metallization layer 202 is etched until the at least one first region 202r of the power metallization layer 202 is completely removed, thereby exposing at least one surface region 200S of the carrier 200. The patterned hard mask layer 206p covers (e.g. in direct physical contact) the power metallization structure 202p formed by the wet etching 220.

As illustrated in FIG. 2B, the power metallization structure 202p may have an aspect ratio greater than about 0.5, e.g. in the range from about 0.5 to about 2. The aspect ratio is defined by the ratio of the height of the structure to its smallest lateral extension. Therefore, the ratio of the height of the power metallization structure 202p, e.g. defined by the thickness 202d of the power metallization layer 202 (i.e. the extension along the thickness direction 105), to its smallest lateral extension, e.g. the extension along the lateral direction 101, is greater than 0.5. According to various embodiments, the power metallization structure 202p may have a feature size (e.g. defined by the smallest lateral extension) less than about 10 µm.

According to various embodiments, the carrier 200 may include for example one or more diode structures, transistor structures, thyristor structures, and, additionally or optionally, a contact metallization structure for contacting the one or more diode structures, transistor structures, thyristor structures and/or for connecting the one or more diode structures, transistor structures, thyristor structures with each other, if desired. According to various embodiments, the contact metallization structure may be configured to connect the power metallization structure 202p with the one or more diode structures, transistor structures, thyristor structures, and/or the like. According to various embodiments, the carrier 200 may include any other suitable electronic structure to be contacted or supplied by a power metallization. According to various embodiments, the power metallization structure 202p may be the uppermost layer of the metallization of the electronic device.

Various modifications and/or configurations of the method 100 and/or the electronic device are described in the following. The features and/or processing steps described in the following may be included in the method 100 or may be combined with the method 100 analogously.

Figure 3A:
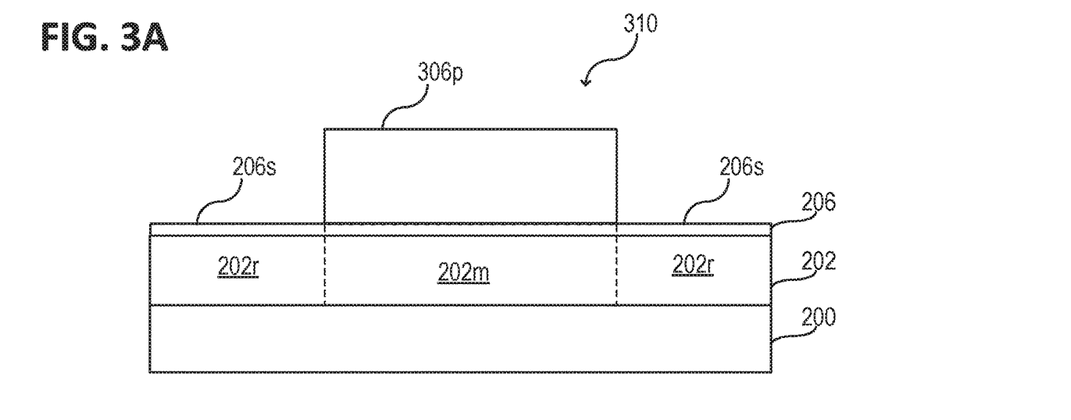
FIGS. 3A and 3B show an electronic device during processing in various schematic views, according to various embodiments.
Figure 3B:
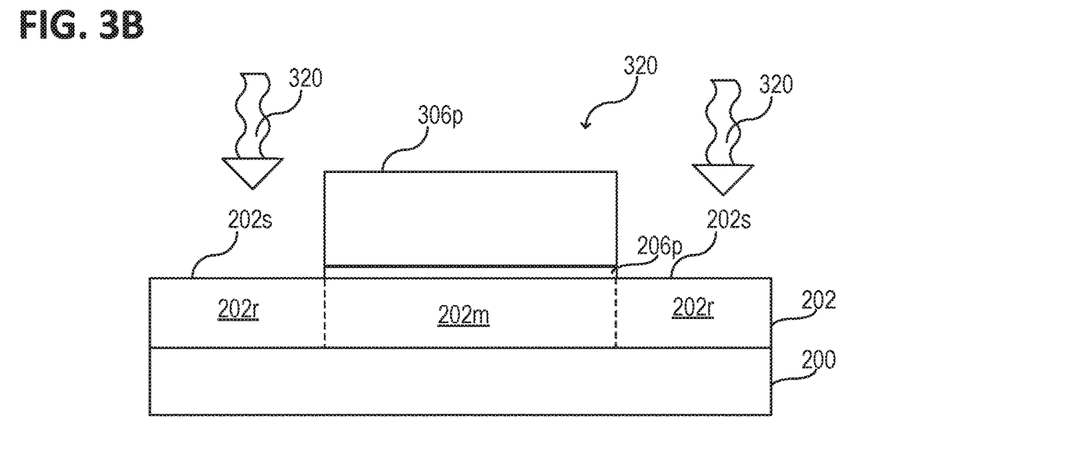

FIG. 3A and FIG. 3B respectively illustrate an electronic device in a schematic cross-sectional view during processing, e.g. during forming the patterned hard mask layer 206p, according to various embodiments.

As illustrated in FIG. 3A, a hard mask layer 206 may be formed over the power metallization layer 202. For patterning the hard mask layer 206, a patterned resist mask layer 306p may be formed over the hard mask layer 206. The patterned resist mask layer 306p exposes at least one surface region 206s of the hard mask layer 206. In general, a patterned resist mask layer 306p may be also referred to as a soft mask or resist mask.

According to various embodiments, a variety of lithographic processes may be applied to generate a mask layer (e.g. to form the patterned resist mask layer 306p over the hard mask layer 206), for example, photolithography, microlithography or nanolithography, electron beam lithography, X-ray lithography, ultraviolet lithography, extreme ultraviolet lithography, interference lithography, and/or the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer). The resist material for the patterned resist mask layer 306p may be applied for example by spin coating, spray coating, and/or the like.

According to various embodiments, several types of resists (e.g. photoresists) may be used adapted to the process of exposing the resist to achieve desired results. According to various embodiments, positive photoresists (e.g. DNQ-Novolac, PMMA, PMIPK, PBS, and/or the like) may be used, whereby the resist that has been exposed to light becomes soluble to a photoresist developer, and/or negative photoresists (e.g. SU-8, poly isoprene, COP, and/or the like) may be used, whereby the resist that has been exposed to light becomes insoluble to a photoresist developer.

As illustrated in FIG. 3B, the exposed at least one surface region 206s of the hard mask layer 206 may be removed (e.g. using an additional wet etching 320) to expose the at least one surface region 202S of the power metallization layer 202, as described above (see for example FIG. 2A).

It should be noted, that a lithographic process, according to various embodiments, including exposing a resist and developing a resist may also be considered as a patterning process, wherein a patterned resist mask layer 306p (a soft mask, or a resist mask) may be generated by the lithographic process, as illustrated in FIG. 3A. Further, according to various embodiments, by an etch process (e.g. wet etching 320) carried out subsequently, a pattern can be transferred from a patterned resist mask layer 306p to the prior deposited or grown hard mask layer 206, wherein the previously deposited or grown hard mask layer 206 may include a hard mask material as for example an oxide or a nitride (e.g. silicon oxide, e.g. silicon nitride) creating a so called hard mask.

According to various embodiments, the mask material (e.g. the resist and/or the hard mask material) may usually be selected with regard to specific needs as for example chemical stability or mechanical stability, e.g. to protect regions from being etched, or to define the shape of structure elements (e.g. of the power metallization structure 202p) to be generated, and/or the like.

Since the desired shapes and structure elements may be generated in their exact dimensions (feature size) during a patterning process, patterning may be a critical process to generate structure elements of electronic devices. Errors during a patterning process may cause a distorted pattern or a misplaced pattern and therefore may change the electrically functioning of a device or of an integrated circuit. Misplacement of a respective structure element (e.g. misplacement of a metal line or a contact pad) may have negative effects on the functionality of the electronic device. Therefore, the patterning process may define a critical feature size, also referred to as critical dimension (CD).

According to various embodiments, the patterning of the hard mask layer 206 by wet etching 320 and the patterning of the power metallization layer 202 by wet etching 220 may be carried out in a single wet etch process based on a single etch chemistry. Alternatively, a plurality of etch processes may be used based on various etch chemistries. However, since both the hard mask layer 206 and the power metallization layer 202 may be patterned by wet etching 220, the one or more wet etchings may be carried out in the very same processing tool.

As illustrated in FIG. 3B, the patterned resist mask layer 306p may cover the patterned hard mask layer 206p. The patterned resist mask layer 306p may remain over the patterned hard mask layer 206p during patterning the power metallization layer 202. In other words, the power metallization layer 202 may be patterned by wet etching 220 of the exposed at least one surface region 202S via the patterned hard mask layer 206p and the patterned resist mask layer 306p covering the patterned hard mask layer 206p.

According to various embodiments, the patterned resist mask layer 306p may be stripped (i.e. completely removed) after patterning the hard mask layer 206 (e.g. by wet etching 320) or, alternatively, after patterning the power metallization layer 202 by wet etching 220. The patterned resist mask layer 306p may be stripped for example by etching (e.g. using an organic stripper) or may be removed by ashing, e.g. by plasma ashing.

According to various embodiments, a method for patterning a power metallization layer 202, as described above, may include: forming a hard mask layer 206 over the power metallization layer 202, the power metallization layer 202 having a thickness 202d greater than about 5 μm; forming a patterned resist mask layer 306p over the hard mask layer 206 and patterning the hard mask layer 206 by wet etching 320 to expose at least one surface region 202S of the power metallization layer 202; and patterning the power metallization layer 202 by wet etching 220 of the exposed at least one surface region 202S of the power metallization layer 202 via the patterned hard mask layer 206p and the patterned resist mask layer 306p. According to various embodiments, the patterned resist mask layer 306p may protect for example the patterned hard mask layer 206p during the wet etching, and, therefore, the patterned hard mask layer 206p may be provided with a small thickness, e.g. with a thickness less than about 15 nm.

Figure 4:
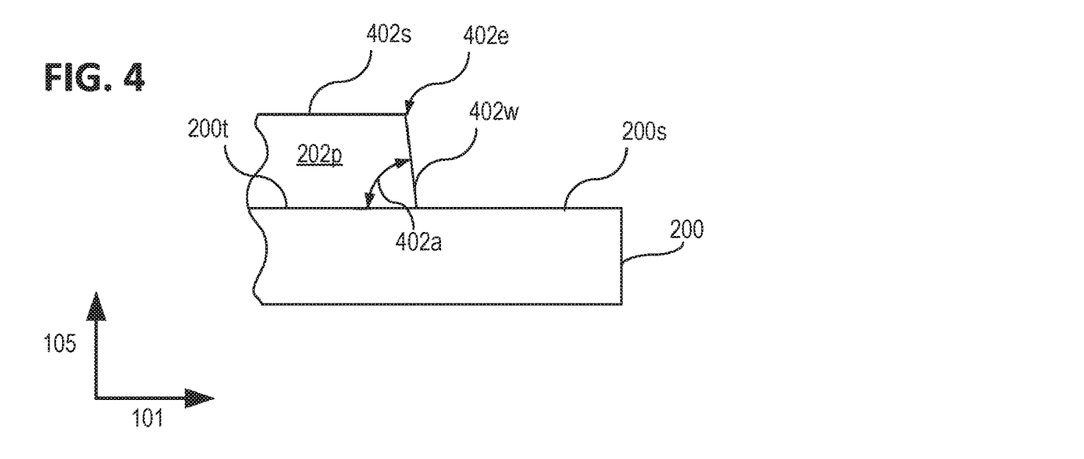
FIG. 4 shows a schematic detailed view of an electronic device, according to various embodiments.

FIG. 4 illustrates a schematic cross-sectional view of the patterned power metallization layer 202p or, in other words, of the power metallization structure 202p formed by method 100, as described herein. The patterning of the power metallization layer 202 exposes at least one sidewall 402w of the power metallization structure 202p, the least one sidewall 402w having a slope 402a greater than about 60°, e.g. in the range from about 60° to about 90°, e.g. in the range from about 60° to about 85°. In other words, the patterned power metallization layer 202p may be provided with a sharp edge 402e and with a steep sidewall 402w. According to various embodiments, the patterning of the power metallization layer 202, as described herein, provides the sidewall 402w of the power metallization structure 202p with a slope 402a greater than about 60°, even for a thick power metallization structure 202p. The slope 402a may be determined as an angle between an upper surface of the carrier 200 and the exposed surface of the sidewall 402w. In a similar way, the slope 402a may be determined as an angle (in the range between 0 and) 90° between the (surface) normal of the carrier and the (surface) normal of the exposed sidewall 402w. According to various embodiments, an upper surface 402s of the power metallization structure 202 may be arranged substantially parallel to an upper surface toot of the carrier 200.

Figure 5A:
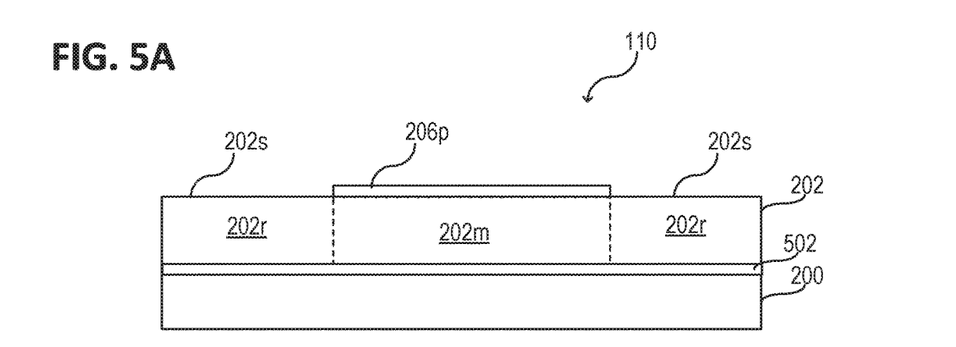
FIGS. 5A to 5C show an electronic device during processing in various schematic views, according to various embodiments.
Figure 5B:
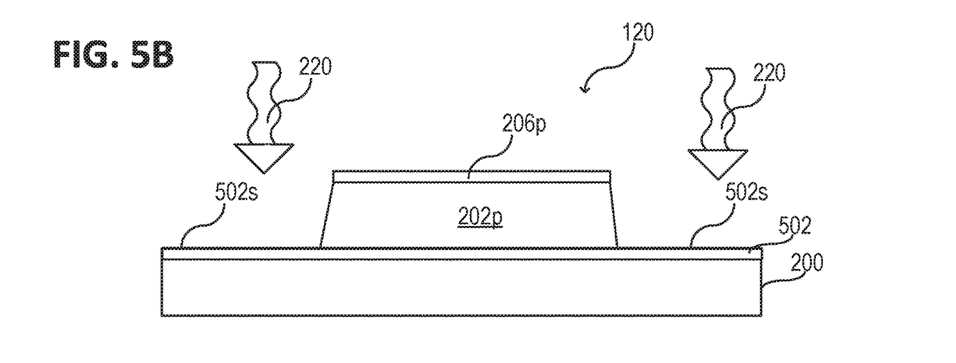
Figure 5C:
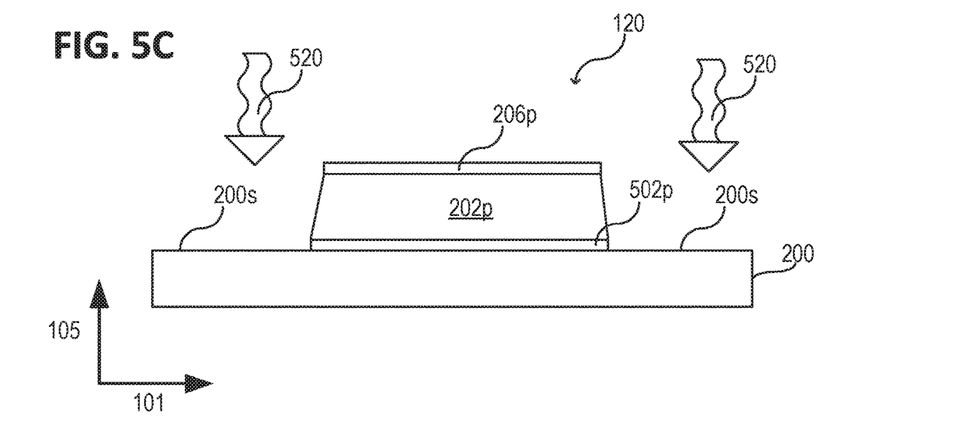

According to various embodiments, a barrier layer 502 may be disposed between the power metallization layer 202 and the carrier 200. Therefore, the barrier layer 502 may be disposed between the power metallization structure 202p and the carrier 200 after patterning the power metallization layer 202. FIG. 5A, FIG. 5B and FIG. 5C respectively illustrate an electronic device in a schematic cross-sectional view during processing, e.g. during patterning the power metallization layer 202 and the barrier layer 502, according to various embodiments.

As illustrated in FIG. 5A, the power metallization layer 202 may be disposed over a barrier layer 502 and the barrier layer 502 may be disposed over the carrier 200. Further, the patterned hard mask layer 206p may be disposed over the power metallization layer 202, as described above, see for example FIG. 2A and FIG. 3B.

As illustrated in FIG. 5B, the power metallization layer 202 may be patterned, as described before. In this case, at least one surface region 502s of the barrier layer 502 is exposed during patterning the power metallization layer 202, i.e. in the case that the at least one first region 202r of the power metallization layer 202 is completely removed. The remaining part 202p of the power metallization layer 202 may partially cover the barrier layer 502. Illustratively, in this case, the patterned hard mask layer 206p and the patterned power metallization layer 202p provide a hard mask structure for patterning the barrier layer 502 in a subsequent etch process 520. According to various embodiments, the barrier layer 502 may be patterned by wet etching 520, as illustrated in FIG. 5C. The at least one surface region 200S of the carrier 200 may be exposed during patterning the barrier layer 502. A remaining part 502p of the barrier layer 502 may be disposed between the power metallization structure 202p and the carrier 200.

According to various embodiments, the barrier layer 502 may include titanium (Ti) and/or tungsten (W), e.g. a TiW-alloy. Alternatively, other barrier materials may be used for forming the barrier layer 502.

According to various embodiments, the functional layers described herein, e.g. the hard mask layer 206, the power metallization layer 202, the barrier layer 502, etc., may be formed by at least one layering process respectively using deposition techniques, which may include chemical vapor deposition (CVD, or a CVD process) and physical vapor deposition (PVD, or a PVD process), according to various embodiments. The thickness of a deposited layer may be in the range of a few nanometers (e.g. 3 nm to 15 nm for the hard mask layer 206) up to several micrometers (e.g. more than 5 µm for the power metallization layer 202) depending on its specific function. Further, a layer may include at least one of an electrically insulating material, an electrically semiconducting material, and an electrically conductive material, depending on the respective specific function of the layer. According to various embodiments, a chemical vapor deposition process (CVD process) may include a variety of modifications, as for example atmospheric pressure CVD (APCVD), low pressure CVD (LPCVD), ultra-high vacuum CVD (UHVCVD), plasma enhanced CVD (PECVD), high density plasma CVD (HDPCVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and/or the like. According to various embodiments, carbon, silicon, nickel, cobalt, iron, ruthenium, rhodium, platinum, iridium, copper, gold, silver, tantalum, titanium nitride, silicon nitride, alumina, and/or the like, may be deposited using LPCVD, ALD, or atomic layer CVD (or using a PVD process). According to various embodiments, physical vapor deposition may include a variety of modifications, as for example sputtering or magnetron sputtering, ion-beam sputtering (IBS), reactive sputtering, high-power impulse magnetron sputtering (HIPIMS), vacuum evaporation, thermal evaporation, molecular beam epitaxy (MBE), pulsed laser deposition, electrochemical deposition (ECD), and/or the like.

Further, patterning (i.e. partially removing) the functional layers described herein, e.g. the hard mask layer 206, the power metallization layer 202, the barrier layer 502, etc., may include one or more etch processes. According to various embodiments, the power metallization layer 202 and the barrier layer 502 may be patterned by a single wet etch process (i.e. within the same wet etch processing tool). According to various embodiments, the hard mask layer 206 and the power metallization layer 202 may be patterned by a single wet etch process (i.e. within the same wet etch processing tool). According to various embodiments, the hard mask layer 206, the power metallization layer 202, and the barrier layer 502 may be patterned by a single wet etch process (i.e. carried out within the same wet etch processing tool). As described above, the patterned resist mask layer 306p (see for example FIG. 3A) that is used for patterning the hard mask layer 206 may remain over the power metallization layer 202 during patterning the power metallization layer 202 and the barrier layer 502. Alternatively, the patterned resist mask layer 306p may be removed before patterning the power metallization layer 202 and the barrier layer 502.

According to various embodiments, the etch chemistry (also referred to as etchant or etching solution) used for at least partially removing the functional layers described herein, e.g. the hard mask layer 206, the power metallization layer 202, the barrier layer 502, etc., may be selected in accordance with the respective material to be etched. According to various embodiments, a copper power metallization layer 202 may be etch for example via nitric acid, phosphoric acid, acetic acid, sulfuric acid, hydrogen peroxide, and/or other suitable etching solutions. According to various embodiments, the hard mask layer 206 may be etched for example wet via diluted hydrofluoric acid (diluted HF), and/or other suitable etching solutions, or with suitable plasma etch procedures.

According to various embodiments, the patterned hard mask layer 206p may at least partially remain over the power metallization structure 202p after process 120 of method 100 is carried out, e.g. as a protection layer, as described before.

Figure 6:
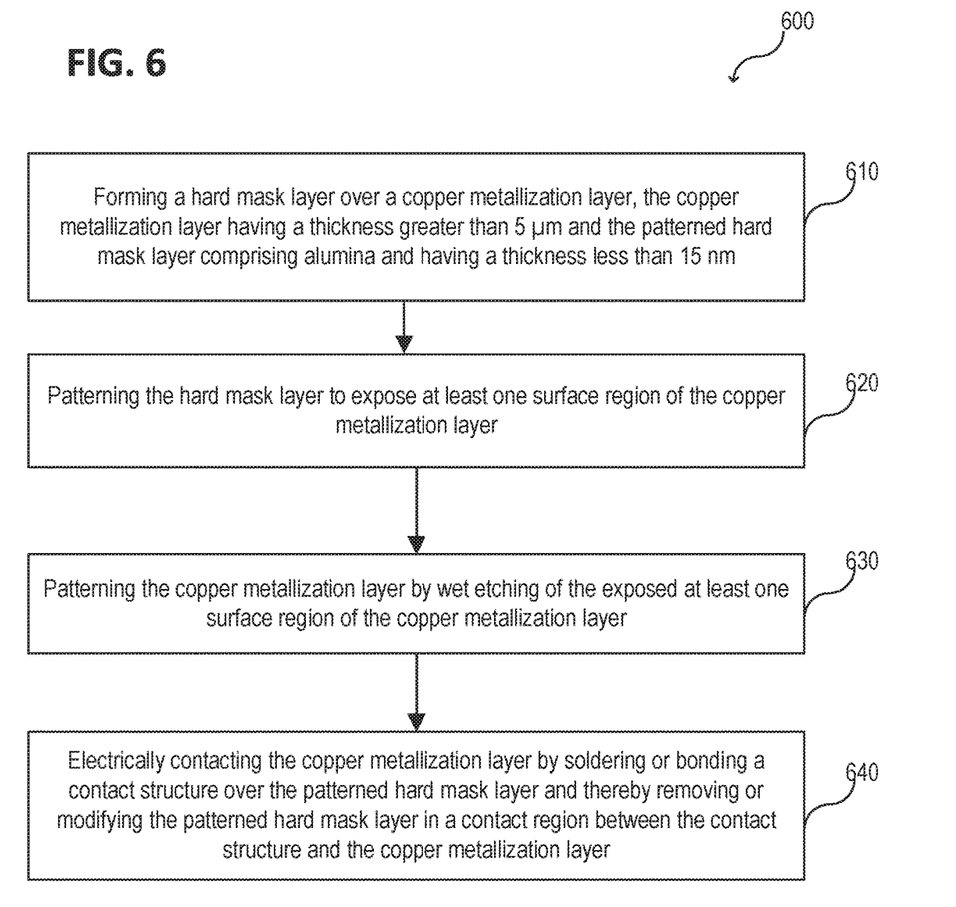
FIG. 6 shows a schematic flow diagram of a method for processing an electronic device, according to various embodiments.

FIG. 6 illustrates a schematic flow diagram of a method 600 for processing an electronic device, according to various embodiments. The method 600 may include, in 610, forming a hard mask layer 206 over a copper metallization layer 202, the copper metallization layer 202 having a thickness 202d greater than 5 µm and the hard mask layer 206 including or consisting of alumina and having a thickness 206d less than 15 nm; in 620, patterning the hard mask layer 206 to expose at least one surface region 202S of the copper metallization layer 202; in 630, patterning the copper metallization layer 202 by wet etching 220 of the exposed at least one surface region 202S of the copper metallization layer 202 (as described before); and subsequently, in 640, electrically contacting the patterned copper metallization layer 202p by soldering or bonding a contact structure over the patterned hard mask layer 206p and thereby at least partially removing and/or modifying the patterned hard mask layer 206p in a contact region between the contact structure and the patterned copper metallization layer 202p. Illustratively, the patterned copper metallization layer 202p may be electrically contacted through the patterned hard mask layer 206p without the need of a separate process for removing the patterned hard mask layer 206p.

Figure 7:
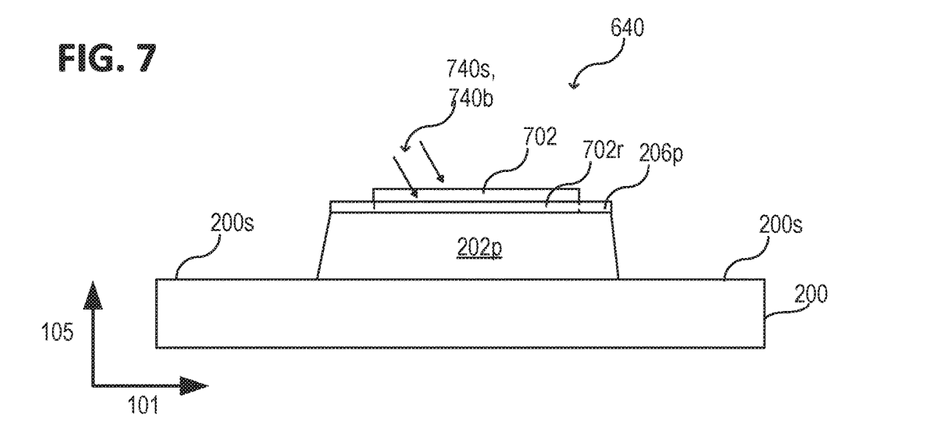
FIG. 7 shows a schematic view of an electronic device during processing, according to various embodiments.

FIG. 7 illustrates an electronic device in a schematic cross-sectional view during processing, e.g. during or after process 640 of method 600 is carried out, according to various embodiments. The processes 610, 620, and 630 of method 600 may be carried out in a similar or the same way, as described above with reference to method 100.

As illustrated in FIG. 7, the patterned copper metallization layer 202*p* may be electrically contacted by soldering 740*s* or bonding 740*b* a contact structure 702 over the patterned hard mask layer 206*p*. Thereby, according to various embodiments, the patterned hard mask layer 206*p* is at least partially removed and/or modified in a contact region 702*r* between the contact structure 702 and the patterned copper metallization layer 202*p*. As a result, the contact structure 702 is electrically conductively connected to the patterned copper metallization layer 202*p*. In a similar way, metal layers including or consisting of any other suitable material may be electrically contacted through a thin layer of alumina. Since the patterned hard mask layer 206*p* may at least partially remain over the patterned metallization layer 202*p*, the surface of the patterned metallization layer 202*p* is protected (e.g. thereby avoiding corrosion or oxidation). According to various embodiments, a remaining portion (after contacting the power metallization structure 202*p*) of the patterned hard mask layer 206*p* may be in direct physical contact with both the power metallization structure 202*p* and the contact structure 702.

Illustratively, the contact region 702*r* may be removed (e.g. the material of the contact region 702*r* may be at least one of mechanically removed, dissolved in the material of the contact structure 702, and/or dissolved in the material of the patterned metallization layer 202*p*) or modified (e.g. the material of the contact region 702*r* may be chemically reduced to a metallic material, e.g. to aluminum) due to the (thermal and/or kinetic) energy impact during soldering 740*s* or bonding 740*b*.

Figure 8:
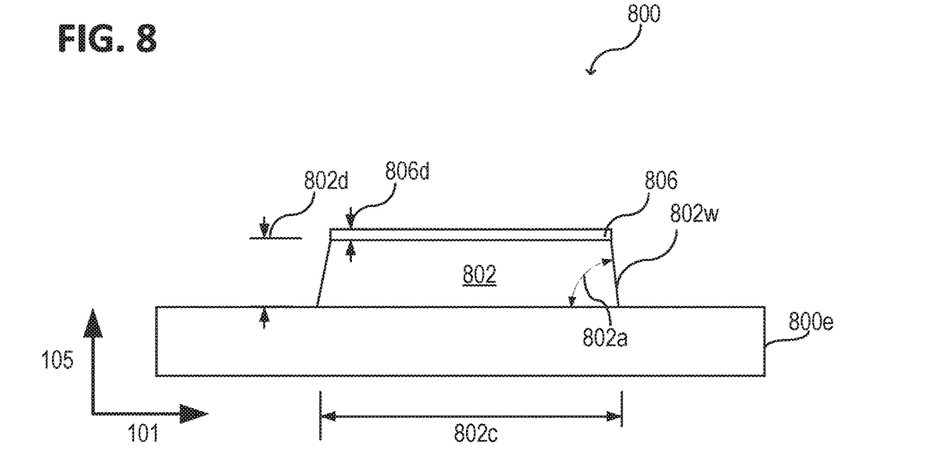
FIG. 8 shows a schematic view of an electronic device, according to various embodiments.

FIG. 8 illustrates an electronic device 800 in a schematic cross-sectional view, according to various embodiments. The electronic device 800 may be formed by method 100 or method 600, as described above. Therefore, it is understood that the features and functionalities described above with reference to the method for processing an electronic device and/or to the method for patterning a power metallization layer may be applicable for the electronic device 800, and vice versa.

According to various embodiments, the electronic device 800 may include an electronic structure 800*e*. The electronic structure 800*e* may be any suitable electronic structure to be contacted or supplied by a power metallization, as described above with reference to the carrier 200.

The electronic device 800 may further include a copper contact structure 802 electrically contacting the electronic structure 800*e*. The copper contact structure 802 may have a thickness 802*d* greater than about 5 µm, or, in other words, the copper contact structure 802 may be a copper power metallization contact. The copper contact structure 802 may include for example a copper contact pad, a copper bump metallization, a copper line, and/or the like. The copper contact structure 802 may be configured as described above with reference to the power metallization structure 202*p*. In a similar way, one or more contact structures including other materials than copper may be used as well.

The electronic device 800 may further include an alumina protection layer 806 having a thickness 806*d* less than about 15 nm. The alumina protection layer 806 is disposed over the copper contact structure 802. The copper contact structure 802 has at least one sidewall 802*w* with a slope 802*a* greater than 60° (cf. sidewall 402*w* and slope 402*a* as illustrated in FIG. 4). According to various embodiments, the thickness of the alumina protection layer 806 has to be less than about 15 nm to allow soldering 740*s* or bonding 740*b* through the alumina protection layer 806 without removing or thinning the alumina protection layer 806 prior to the soldering 740*s* or bonding 740*b*.

According to various embodiments, the copper contact structure 802 may have an aspect ratio greater than about 0.5. In other words, the copper contact structure 802 may be patterned to have a relatively large thickness compared to the feature size (in other words compared to the smallest lateral extension). According to various embodiments, the copper contact structure 802 may have a feature size 802*c* (e.g. defined by the smallest lateral extension) less than about 10 µm.

According to various embodiments, the electronic device 800 illustrated in FIG. 8 may be electrically contacted by soldering 740*s* (e.g. using lead free solder) or bonding 740*b* (e.g. wire bonding), as described with reference to FIG. 7 and process 640 of method 600.

According to various embodiments, the carrier 200 or the electronic structure 800*e*, as described above, may include a semiconductor workpiece (e.g. a semiconductor substrate, a semiconductor wafer, a deposited semiconductor layer, an epitaxial semiconductor layer, and/or the like). The semiconductor workpiece may be made of or may include silicon. However, other semiconductor materials of various types may be used in a similar way, e.g. germanium, Group III to V (e.g. SiC), or other types, including for example polymers. In an embodiment, the semiconductor layer is a wafer made of silicon (e.g. p-type doped or n-type doped). In an alternative embodiment, the carrier may be a silicon on insulator (SOI) wafer.

Various embodiments are related to a power metallization or a power device. The term "power" used with regards to a "power" device, "power" integrated circuit structure, or "power" metallization, as well as "power" integrated circuit, "power" transistor, "power" diode, and the like, may be used herein to mean that the device, the circuit structure, or the metallization may be configured to handle high electrical currents, e.g. electrical currents greater than about 1 A, 2 A, 5 A or 10 A; or electrical currents in the range from about 1 A to about 1000 A, or electrical currents even greater than about 1000 A, and to handle high electrical voltages, e.g. electrical voltages greater than 20 V, 30 V, 50 V, or 100 V; or electrical voltages in the range from about 20 V to about 10 kV, or electrical voltages even greater than about 10 kV. According to various embodiments, a power device may be operated as switch or as rectifier. Further, a power device may be capable of carrying high current and may have a high reverse blocking voltage (e.g. the reverse blocking voltage may be greater than about 20 V, 30V, 100 V or 1000 V; or even greater than about 1000 V).

According to various embodiments, a single metal line or contact pad of a power metallization for contacting a power semiconductor device (e.g. for contacting a power transistor or a power diode) may be able to transport an electrical current greater than about 1 A, 2 A, 5 A, or 10 A. According to various embodiments, in the manufacture or design of a power metallization, aspects, like for example, electro migration, heat dissipation, and thermal stability are to be considered.

An electronic device or an electronic structure, as referred to herein, may be or may include at least one of the following: a semiconductor device or a semiconductor structure, a semiconductor power device or a semiconductor power structure, or any suitable type of integrated circuit structure. According to various embodiments, an electronic device or an electronic structure may be or may include at least one of the following: a two terminal device, e.g. a diode (a PIN diode or a Schottky diode, e.g. a SiC Schottky diode), and/or a three terminal device, e.g. a power MOSFET (metal oxide semiconductor field-effect transistor), a JFET (junction gate field-effect transistor), e.g. a SiC JFET, a thyristor (e.g. in metal oxide semiconductor (MOS) technology), an IGBT (insulated-gate bipolar transistor), and the like. Further, according to various embodiments, an electronic device or an electronic structure may be or may include any other suitable multi terminal device, e.g. with four or more than four terminals, e.g. a transmitter device, a receiver device, a transceiver device, an RF-(radio frequency)-switch, and the like. Further, according to various embodiments, an electronic device or an electronic structure may be or may include any other suitable electronic structure, e.g. a rechargeable battery, a sensor, a mems structure, and/or the like.

According to various embodiments, a copper power metallization layer 202, a copper power metallization structure 202p, a copper contact structure 802p, etc., may substantially consist of copper, i.e. including at least 50 molar percent of copper, e.g. more than 60 molar percent, more than 70 molar percent, more than 80 molar percent, or more than 90 molar percent. However, low quantities of impurities may be included in the material of the copper power metallization layer 202, the copper power metallization structure 202p, and/or the copper contact structure 802p. According to various embodiments, an alumina layer (e.g. used as a hard mask or as part of a hard mask 206, 206p and/or as a protection layer 806) may substantially consist of alumina (e.g. Al$_2$O$_3$), i.e. including at least 50 molar percent of alumina, e.g. more than 60 molar percent, more than 70 molar percent, more than 80 molar percent, or more than 90 molar percent. However, low quantities of impurities may be included in the material of the alumina layer. According to various embodiments, a Ti/W-alloy layer (e.g. used as a barrier layer 502) may substantially consist of titanium and tungsten, i.e. including at least 50 molar percent of titanium and tungsten, e.g. more than 60 molar percent, more than 70 molar percent, more than 80 molar percent, or more than 90 molar percent. However, low quantities of impurities may be included in the material of the Ti/W-alloy layer.

In the following, various Examples are provided referring to the embodiments and illustrations described above.

Example 1 is a method 100 for processing an electronic device, the method 100 including: forming a patterned hard mask layer 206p over a copper power metallization layer 202, the patterned hard mask layer 206p exposing at least one surface region 202S of the copper power metallization layer 202; and patterning the copper power metallization layer 202 by wet etching 220 of the exposed at least one surface region 202S of the copper power metallization layer 202. According to various embodiments, it was found that a resist mask in direct contact with a thick copper power metallization layer 202 may not allow forming a sharp edge after wet etching.

In Example 2, the method 100 of Example 1 may include that the patterned hard mask layer 206p is formed directly on (i.e. in direct physical contact with) the copper power metallization layer 202.

In Example 3, the method 100 of Example 1 or 2 may include that forming the patterned hard mask layer 206p includes forming at least one layer of the following group of layers: a patterned metal layer, a pattered nitride layer, a patterned oxide layer, a patterned oxynitride layer.

In Example 4, the method 100 of Example 1 or 2 may include that forming the patterned hard mask layer 206p includes forming a patterned alumina layer.

In Example 5, the method according to Example 4 may include that the patterned alumina layer is a sole (i.e. the one and only) patterned hard mask layer 206p disposed over the power metallization layer 202.

In Example 6, the method according to Example 4 or 5 may include that the patterned alumina layer is formed with a thickness 206d less than 15 nm. The patterned alumina layer may be formed with a thickness 206d in the range from 3 nm to 15 nm.

In Example 7, the method according to Example 4 or 5 may further include thinning the patterned alumina layer to a thickness less than 15 nm after patterning the power metallization layer 202. The patterned alumina layer may be thinned to a thickness 206d in the range from 3 nm to 15 nm.

In Example 8, the method according to any one of Examples 1 to 7 may further include at least partially (e.g. partially or completely) removing the patterned hard mask layer 206p after patterning the power metallization layer 202.

In Example 9, the method according to Example 8 may include that at least partially removing the patterned hard mask layer 206p includes wet etching.

In Example 10, the method according to any one of Examples 1 to 9 may include that forming the patterned hard mask layer 206p includes: forming a hard mask layer 206 over the copper power metallization layer 202; forming a patterned resist mask layer 306p over the hard mask layer 206, the patterned resist mask layer 306p exposing at least one surface region 206s of the hard mask layer 206; and removing the exposed at least one surface region 206s of the hard mask layer 206 to expose the at least one surface region 202S of the copper power metallization layer 202.

In Example 11, the method according to Example 10 may include that forming the patterned resist mask layer 306p includes forming a resist layer over the hard mask layer 206 and patterning the resist layer by photolithography.

In Example 12, the method according to Example 10 or 11 may include that the patterned resist mask layer 306p covers the patterned hard mask layer 206p during patterning the copper power metallization layer 202.

In Example 13, the method according to any one of Examples 10 to 12 may further include stripping the patterned resist mask layer 306p.

In Example 14, the method according to any one of Examples 10 to 13 may include that removing the exposed at least one surface region 206s of the hard mask layer 206 includes wet etching 320.

In Example 15, the method according to any one of Examples 1 to 14 may include that the copper power metallization layer 202 has a thickness 202d greater than 5 μm. The copper power metallization layer 202 has for example a thickness greater than 8 μm. According to various embodiments, the patterned copper power metallization layer 202p has for example the same thickness as the copper power metallization layer 202 before pattering.

In Example 16, the method according to any one of Examples 1 to 15 may include that patterning the copper power metallization layer 202 includes exposing at least one sidewall 402w, the least one sidewall 402w having a slope 402a greater than 60°.

In Example 17, the method according to any one of Examples 1 to 16 may include that the copper power metallization layer 202 is disposed over a barrier layer 502.

Further, at least one surface region 502s of the barrier layer 502 is exposed during patterning the copper power metallization layer 202.

In Example 18, the method according to Example 17 may include that the barrier layer 502 includes or consists of titanium, tungsten and/or a titanium/tungsten alloy.

In Example 19, the method according to Example 17 or 18 may further include removing (e.g. partially or completely) the exposed at least one surface region 502s of the barrier layer 502.

In Example 20, the method according to Example 19 may include that removing the exposed at least one surface region 502s of the barrier layer 502 includes wet etching 520.

Example 21 is a method 600 for processing an electronic device, the method including: forming a hard mask layer 206 over a copper metallization layer 202, the copper metallization layer 202 having a thickness 202d greater than 5 μm and the hard mask layer 206 including alumina and having a thickness 206d less than 15 nm; patterning the hard mask layer 206 to expose at least one surface region 202S of the copper metallization layer 202; patterning the copper metallization layer 202 by wet etching 220 of the exposed at least one surface region 202S of the copper metallization layer 202; and subsequently, electrically contacting the patterned copper metallization layer 202p by soldering 740 or bonding a contact structure 702 over the patterned hard mask layer 206p and thereby at least partially removing or modifying the patterned hard mask layer 206p in a contact region 702r between the contact structure 702 and the patterned copper metallization layer 202p.

Example 22 is a method for patterning a power metallization layer 202, the method including: forming a hard mask layer 206 over the power metallization layer 202, the power metallization layer 202 having a thickness 202d greater than 5 μm; forming a patterned resist mask layer 306p over the hard mask layer 206 and patterning the hard mask layer 206 by wet etching 320 to expose at least one surface region 202S of the power metallization layer 202; and patterning the power metallization layer 202 by wet etching 220 of the exposed at least one surface region 202S of the power metallization layer 202 via the patterned hard mask layer 206p and the patterned resist mask layer 306p.

Example 23 is an electronic device 800, including: an electronic structure 800e; a copper contact structure 802 electrically contacting the electronic structure 800e, the copper contact structure 802 having a thickness 802d greater than 5 μm, an alumina protection layer 806 having a thickness 806d less than 15 nm and disposed over the copper contact structure 802, wherein the copper contact structure 802 has at least one sidewall 802w with a slope 802a greater than 60°.

In Example 24, the electronic device 800 according to Example 23 may include that the copper contact structure 802 has an aspect ratio of greater than 0.5.

In Example 25, the electronic device 800 according to Example 23 or 24 may include that the copper contact structure 802 has a feature size 802c less than 10 μm.

Example 26 is a method for processing an electronic device, the method including: forming a patterned hard mask layer 206p over a power metallization layer 202, the patterned hard mask layer 206p exposing at least one surface region 202S of the power metallization layer 202; and patterning the power metallization layer 202 by wet etching 220 of the exposed at least one surface region 202S of the power metallization layer 202.

Example 27 is a method for processing an electronic device, the method including: forming a hard mask layer 206 over a metallization layer 202, the metallization layer 202 having a thickness 202d greater than 5 μm and the hard mask layer 206 having a thickness 206d less than 15 nm; patterning the hard mask layer 206 to expose at least one surface region 202S of the metallization layer 202; patterning the metallization layer 202 by wet etching 220 of the exposed at least one surface region 202S of the metallization layer 202; and subsequently, electrically contacting the patterned metallization layer 202p by soldering 740 or bonding a contact structure 702 over the patterned hard mask layer 206p and thereby at least partially removing or modifying the patterned hard mask layer 206p in a contact region 702r between the contact structure 702 and the patterned metallization layer 202p.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A method for processing an electronic device, the method comprising:
   forming a patterned hard mask layer over a copper power metallization layer, the patterned hard mask layer exposing a major outer surface of the copper power metallization layer; and
   patterning the copper power metallization layer by wet etching of the exposed major surface of the copper power metallization layer, wherein forming the patterned hard mask layer comprises forming a patterned alumina layer with a thickness less than 15 nm, wherein the copper power metallization layer has a thickness greater than 5 μm.

2. The method according to claim 1, wherein forming the patterned hard mask layer comprises forming at least one layer of the following group of layers:
   a patterned metal layer,
   a pattered nitride layer,
   a patterned oxide layer, or
   a patterned oxynitride layer.

3. The method according to claim 1, further comprising:
   partially removing the patterned hard mask layer after patterning the power metallization layer.

4. The method according to claim 1, wherein forming the patterned hard mask layer comprises:
   depositing a hard mask layer over the copper power metallization layer;
   forming a patterned photoresist mask layer over the hard mask layer, the patterned photoresist mask layer exposing a major surface of the hard mask layer; and
   using the patterned photoresist mask layer as an etch mask, etching the hard mask layer to expose the major outer surface of the copper power metallization layer.

5. The method according to claim 1, wherein patterning the copper power metallization layer comprises exposing a sidewall, the sidewall having a slope greater than 60°.

6. The method according to claim 1, further comprising forming a contact structure over the patterned hard mask layer by partially removing and/or modifying the patterned hard mask layer in a contact region between the contact structure and the patterned copper metallization layer.

7. A method for processing an electronic device, the method comprising:
forming a patterned hard mask layer over a copper power metallization layer, the patterned hard mask layer exposing a major outer surface of the copper power metallization layer;
patterning the copper power metallization layer by wet etching of the exposed major surface of the copper power metallization layer; and
forming a barrier layer, wherein the copper power metallization layer is formed over the barrier layer, and wherein a surface of the barrier layer is exposed after the patterning the copper power metallization layer, wherein the barrier layer comprises titanium and/or tungsten.

8. The method of claim 7, wherein forming the patterned hard mask layer comprises forming a patterned alumina layer with a thickness less than 15 nm, wherein the copper power metallization layer has a thickness greater than 5 µm.

9. A method for patterning a power metallization layer, the method comprising:
forming a hard mask layer over the power metallization layer;
forming a patterned soft mask layer over the hard mask layer and patterning the hard mask layer by wet etching to expose a major outer surface of the power metallization layer; and
patterning the power metallization layer by wet etching of the exposed major outer surface of the power metallization layer using an etch mask comprising the patterned hard mask layer and the patterned soft mask layer.

10. The method according to claim 9, wherein a contact structure is formed over the patterned hard mask layer to electrically couple the contact structure and the patterned power metallization layer.

11. The method according to claim 9, wherein modifying the patterned hard mask layer comprises reducing a metal in the patterned hard mask layer.

12. The method according to claim 9, wherein forming the hard mask layer comprises depositing a alumina layer with a thickness less than 15 nm, wherein the power metallization layer comprises a copper layer having a thickness greater than 5 µm.

13. The method according to claim 9, wherein the hard mask layer comprises titanium, tantalum, hafnium, boron, silicon, or carbon.

14. The method according to claim 9, further comprising forming a barrier layer, wherein the power metallization layer is formed over the barrier layer, and wherein a surface of the barrier layer is exposed after the patterning the power metallization layer, wherein the barrier layer comprises titanium and/or tungsten.

15. The method according to claim 9, wherein patterning the power metallization layer comprises exposing a sidewall, the sidewall having a slope greater than 60°.

16. An electronic device comprising:
an electronic structure;
a copper contact structure electrically contacting the electronic structure, the copper contact structure having a thickness greater than 5 µm; and
an alumina protection layer having a thickness less than 15 nm and disposed over the copper contact structure, wherein the copper contact structure has a sidewall with a slope greater than 60°.

17. The electronic device according to claim 16, further comprising a contact structure electrically coupled to the copper contact structure disposed over the alumina protection layer.

18. The electronic device according to claim 16, wherein the copper contact structure has an aspect ratio of greater than 0.5.

19. The electronic device according to claim 16, wherein the copper contact structure has a feature size less than 10 µm.

20. The electronic device according to claim 16, further comprising a barrier layer, wherein the copper contact structure is disposed over the barrier layer, and wherein the barrier layer comprises titanium and/or tungsten.

* * * * *